United States Patent [19]

Andersen

[11] Patent Number: 5,580,698
[45] Date of Patent: Dec. 3, 1996

[54] SCANNER SYSTEM FOR SUCCESSIVE IRRADIATION OF A WORKING SURFACE, PARTICULARLY FOR ULTRA-VIOLET EXPOSURE OF A PHOTO EMULSION ON A SERIGRAPHIC PRINTING FRAME

[75] Inventor: Allan V. Andersen, Skanderborg, Denmark

[73] Assignee: MOGRAFO A/S, Switzerland

[21] Appl. No.: 391,076

[22] Filed: Feb. 17, 1995

Related U.S. Application Data

[63] Continuation of Ser. No. 84,121, Jul. 1, 1993, abandoned, which is a continuation of Ser. No. 603,661, Nov. 1, 1990, abandoned.

[30] Foreign Application Priority Data

| May 5, 1988 | [DK] | Denmark | 2438/88 |
| Dec. 8, 1988 | [DK] | Denmark | 6834/88 |

[51] Int. Cl.⁶ .............. G03F 7/12; G03F 7/00; B05C 17/06; G02B 26/08
[52] U.S. Cl. ............ 430/308; 430/30; 430/300; 430/945; 101/128.21; 101/128.4; 101/467; 359/197; 359/199; 359/208
[58] Field of Search ............ 430/30, 300, 308, 430/945; 101/53, 81, 84, 128.21, 128.4, 467; 359/197, 199, 208

[56] References Cited

U.S. PATENT DOCUMENTS 3,610,119  10/1971  Gerber et al. .............. 355/81
3,610,724  10/1971  Frizzell .............. 355/81
4,499,176  2/1985  Curtis et al. .............. 430/308
4,505,578  3/1985  Balasubramanian .............. 355/53
4,806,946  2/1989  Ohnishi .............. 346/108

Primary Examiner—George F. Lesmes
Assistant Examiner—Bernard P. Codd
Attorney, Agent, or Firm—Kane, Dalsimer, Sullivan, Kurucz, Levy, Eisele and Richard, LLP

[57] ABSTRACT

For producing fine printing patterns on large serigraphical printing frames it is possible to apply an exposure through correspondingly large film areas, but it is cheaper to make use of a successive line-by-line exposure with the use of a modulated light or laser beam, which is caused to sweep across an emulsion coated printing frame surface from an oscillating deflection mirror. The beam (20), in its outermost positions, will be directed obliquely towards the surface (14), and if the latter changes its distance from the oscillating mirror (48) the exposure lines (16) will thus be correspondingly shorter or longer, whereby the printing pattern may be distorted. According to the invention this can be counteracted by the light ray being brought to pass a lense bar (56) mounted just in front of the line of exposure and adapted so as to deflect, all along the line, the light beam such that it will hit the surface perpendicularly, whereby the length or the lines will be independent of occurring distance variations. The width of the lense bar (56) should be at least twice the line width, as the invention also provides for a transverse displacement of the light beam for achieving that the latter may be delivered from a resonance oscillating goniometer mirror (48) with a high operational speed without overlappings occurring between the consecutive lines of exposure.

7 Claims, 2 Drawing Sheets

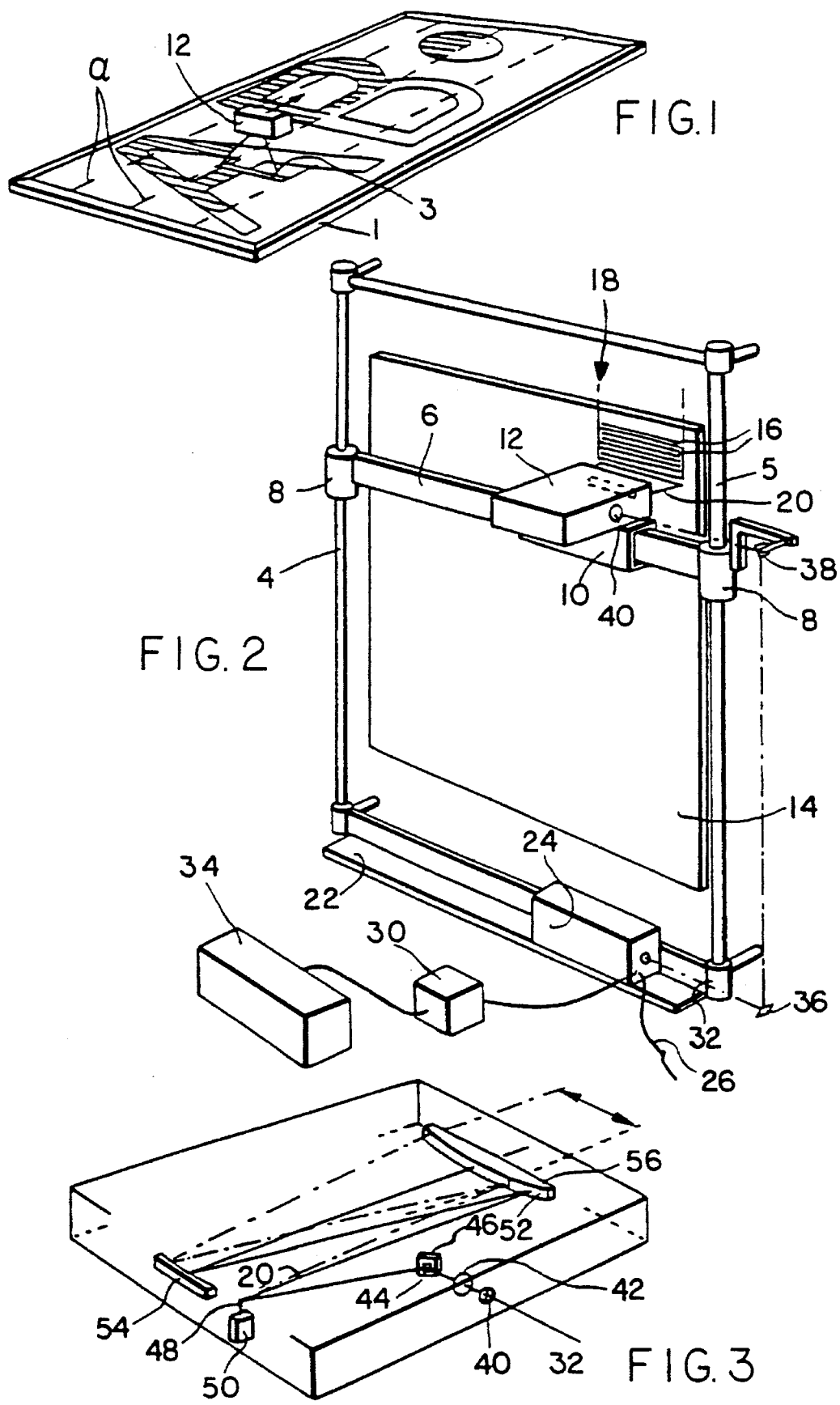

SCANNER SYSTEM FOR SUCCESSIVE IRRADIATION OF A WORKING SURFACE, PARTICULARLY FOR ULTRA-VIOLET EXPOSURE OF A PHOTO EMULSION ON A SERIGRAPHIC PRINTING FRAME

This application is a continuation of application No. 08/084,121, filed Jul. 1, 1993, now abandoned which was a continuation of application No. 07/603,661, filed on Nov. 1, 1990, now abandoned.

FIELD OF THE INVENTION

The present invention relates to a method of preparing graphical printing elements of the serigraphical printing frame type with a view to the production of a printing surface, which in accordance with a model pattern, is formed with areas which are respectively permeable and non-permeable to dye.

BACKGROUND OF THE INVENTION

In this field it is common practice to lay out a photographic emulsion on the permeable fabric layer of a serigraphic printing frame and to cover the emulsion, with a photographic film indicating the desired print picture in full size, after which the assembly is irradiated with powerful ultraviolet light for exposing the emulsion on the fabric layer through a contact print of the film picture, so that afterwards it is possible to treat the emulsion in such a manner that it becomes selectively permeable to dye in accordance with the desired pattern.

However, this is a troublesome and expensive process, because it may be expensive to produce the required films in the relatively very large sizes which may occur, for example, with edge dimensions essentially exceeding 1 meter both lengthwise and crosswise.

SUMMARY OF THE INVENTION

The invention is based on the acknowledgment that it is possible to affect the photographic emulsion in a more direct manner, for example, by irradiating it with a concentrated light beam, which is controlled so as to describe the desired print picture on the print surface. Typically, a laser beam may be applied which, from a transmission head, is caused to sweep over the surface of the emulsion by a scanning process which by an associated computer control produces just the desired printing pattern, without the latter having to be present in full size.

It has been found, however, that such a scanning cannot easily cover a lane area with a width of more than 50–60 cm, which is far too small in the performance of many relevant tasks of printing, for which reason it has been necessary to operate with the contact prints in case of broader subjects. The width limitation in question is due to certain basic limitations of a modulated scanning; in connection with the invention it has not been found possible to alter said limitations.

On this background the invention proposes to carry out the preparation of an extended emulsion coated print surface by successively irradiating the area from a beam head in parallel, adjoining lanes of limited width, provision being made to control the operation in such a manner that the individual lane portions are coherent as to the motif.

In order to obtain a reasonably good result, that is, without essential visible distortions of the print pattern in the border line areas between the various scanning lanes, it is not sufficient to carry out an accurate mechanical guiding of a scanner head with relation to the print element, as more problems in connection with the scanning process are associated with the production of such an accurate side bounding of the scanning lane, that this lane can fulfil the requirement of accurate merging with the adjacent lane or lanes. In case of a single lane edge displacements of the order of 1 mm will normally be insignificant, whereas, such displacement will be quite unacceptable in case of, for example, a vertical border line inside a print pattern surface, where the aim should be to keep possible displacement below 0.1 mm, as otherwise visually noticeable border lines may be formed even in coarse print patterns, though it may be difficult to concretely show the presence of such border lines.

In accordance with the method of the present invention, to prepare graphical printing elements of a serigraphic frame type with a view toward forming a printing surface, which, in accordance with a model pattern is formed with areas, which are permeable and non-permeable respectively to dye, the forming is achieved by scanning with a light beam, preferably, an ultraviolet laser light, modulated from a control unit and directed towards a photographic emulsion placed on the printing surface, after which the printing surface is treated for development and fixation of the printing pattern. A printing surface with a width exceeding 20 cm and an arbitrary length is prepared for forming a continuous printing pattern by scanning along parallel lines with respective accurately coincident side limitations, and with provision being made to control the operation in such a manner that the printing pattern is reproduced coherently across the side limitations.

In accordance with the present invention, the scanning along the individual lines is performed successively by one and the same scanner, which scanner is displaced longitudinally and transversely relative to the printing element.

The scanning unit of the scanning device or plurality of such units are movable along parallel lines, with the side limitation lines being exactly coincident. Associated control equipment may be provided which is adapted to ensure that the desired printing pattern is reproduced correctly across the limitation lines.

According to the scanning device of the present invention, at a short distance from the working surface, the scanning unit is provided with a lens bar, with the lens bar being placed in a plane of movement of an oscillating light or laser beam. The lens bar has the form of a convex lens with its focal point located in a rotating or oscillating mirror so as to direct the beam toward the working surface perpendicularly thereto along an entire length of the working line.

Advantageously, the width of the lens bar corresponds to at least twice a width of the working line, with the scanning unit comprising a back and forth swinging type deflecting mirror and a controlled optical element, preferably, a mirror element, for displacing the beam by a line width transversely of the plane of oscillation during each half period of oscillation and for displacing the beam correspondingly, but abruptly and with an opposite sign at each end of the successive working lines.

The oscillating mirror, in accordance with the present invention, is a goniometer controlled resonance swinging type mirror, with the optical system comprising a means for producing, from a beam deflection according to a sine function, a final beam travel along each working line with constant velocity.

The controlled optical element is a mirror mounted on a piezoelectric crystal and, according to the invention, a control unit is associated with the crystal and is adapted to be programmed to correct the orthogonal deflection in the optical system.

Therefore the present invention also deals thoroughly with the scanner itself, as an improved version thereof is almost a condition of making the invention broadly applicable, which, of course is the result aimed at. Therefore this important aspect of the invention will be discussed in detail below.

BRIEF DESCRIPTION OF THE DRAWINGS

The invention will be explained in more detail in the following with reference to the drawings, in which:

FIG. 1 is a schematic, perspective view illustrating the principal invention;

FIG. 2 is a perspective view of a system for execution of a scanning in accordance with the invention;

FIG. 3 is a perspective detail view of a scanner unit used in the system of FIG. 2;

DETAILED DESCRIPTION

Figure 4:
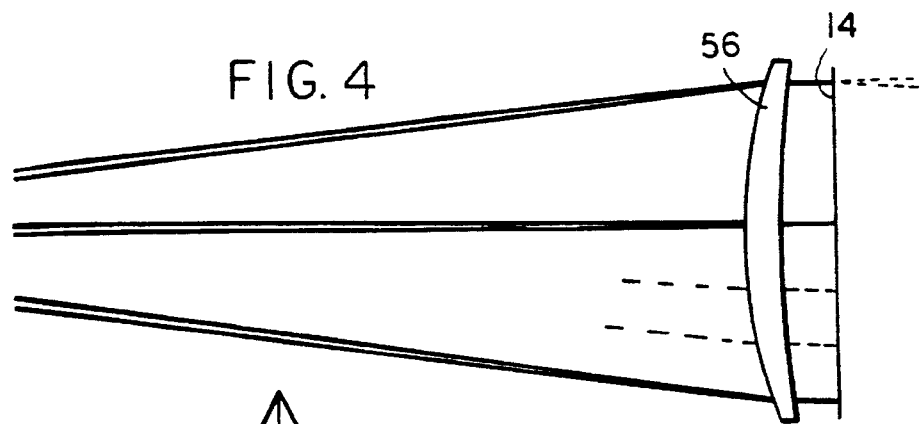
FIG. 4 is a schematic view of the output end of the scanner opposite the working surface.

FIG. 1 as shown in, a serigraphical frame 11, placed below a laser scanner 12, which sweeps across the print surface of the frame along a transverse line 3 which is considerably shorter than a width of the print surface. The print surface is coated with a photographic emulsion which is meant to be irradiated for the production of the print pattern indicated by outlines. Of course, the pattern may assume any form other than the form illustrated in FIG. 1.

The scanner 12 is, mounted with respect to the frame, so as to be displaceable both lengthwise and transversely across the print surface of the frame, but controlled to move very accurately parallel therewith, so that the length of the scanner line 3 will be the same everywhere at the occuring angular oscillation of the laser beam from the scanner.

The ideal situation would be one, in which the scanner can be moved a single time across the middle of the frame and all the way produce the line 3 with a length that is sufficient to cover the entire width of the printing surface, whereby the desired printing pattern can be produced by a suitable computer controlled modulation of the light beam. Only it appears in practice that the obtainable length of line 3 is so limited that it cannot be extended to the entire width of only fairly large printing surfaces.

In the light of this the invention provides for controlling the scanner 12 to move in such a manner, relatively, that it can work the printing surface along parallel partial zones or lanes shown in the drawing separated by stippled lines a. With a suitable programming of the control computer it can be obtained that the scanner 12 is moved successively along the respective zones to irradiate these zones for producing the partial pictures of the print motif associated with the zones. Hereby it is insignificant whether the absolute length of the line 3 is somewhat larger than the width of the zones, if only it is secured that the laser beam is extinguished in the areas where it is potentially directed towards adjacent zone areas which should not be irradiated in the cycle of operation in question. As shown in FIG. 2, the system of the present invention comprises a wall mounted frame with vertical guide members 4, 5, between which is mounted a vertically displaceable cross rail 6 provided with sliding sleeves 8 which embrace the guide members 4, 5, means (not shown) being provided for causing a downward movement of the cross member or rail 6, and sliding sleeves 8 along the guide members 4, 5 with a smooth, relatively low speed and an upward movement with substantially higher speed.

A horizontally displaceable carrier 10 for a scanning device 12 is mounted on the cross rail 6. The carrier 10 is, in a manner not shown, provided with a motor part for controlled movement of the part and hence the scanner 12 along the cross rail 6. A working subject 14 in the form of a serigraphic frame with a photo emulsion coating to be treated by irradiation from the scanner 12 may be placed on the wall surface within the frame, it being shown that the scanner 12 can work the surface by irradiating the surface in horizontal lines 16 downwardly along a vertical lane field 18, as a light beam 20 oscillating backwards and forwards is supplied from the scanner 12 during the lowering of the scanner 12 on the cross rail 6. The speed of lowering is adjusted so that the lines 16 of irradiation will be drawn edge, to edge as viewed seen in relation to the oscillating frequency of the beam 20.

A UV-laser 24 is mounted on a lower fixed support 22 provided on the frame; A power supply line 26 is provided for the laser 24. A conventional modulator (not shown) and control unit 30 are connected to laser 24 for controlling and for switching the laser beam 32 on and off. The control unit 15 connected to a computer 34, in which the desired print pattern can be recovered. Furthermore, in a manner not shown, the computer 34 or the control unit is connected to the means for moving the carrier 10 of the scanner and for vertically moving the cross rail 6.

The laser beam 32 hits a fixed deflecting mirror 36, which directs the beam vertically upwardly along a right side of the frame 4, where it hits a second mirror 38 placed on the right sliding sleeve 8, from which it is transmitted to the scanner 12 through an opening 40 in the side thereof. Within the scanner 12, the beam passes various lens and mirror systems as described below with the result being that the beam finally appears an an oscillating beam directed towards the working subject 14. It will be understood that by a very accurate construction of the mechanical system it is ensured that the laser beam, at all times is introduced into the scanner 12 in the same place and with the same direction, no matter how the scanner 12 is moved vertically and horizontally.

In a system as described above it would, in principle, be possible to use a scanner 12 of a previously known construction, but in most cases for the result would be highly useless for two reasons, i.e. partly because the prior art scanners operate either far too slow to be practically usable for the present application, or much too inaccurate to produce sharply linearly limited working zones, which can be joined to adjacent zones without clearly visible transitions.

Therefore, according to the invention, it has been considered necessary to make use of a further developed scanner, with the problems presenting themselves in connection therewith being explained in more detail hereinbelow.

In the scanning process several essential problems occur when an ultraviolet laser beam is used and when print patterns of high quality, i.e. high degree of resolution of the pattern, are desired. The production of ultraviolet light is rather costly wherefore reduction of the losses to the least possible should be aimed at, and the demand for a high degree of resolution involves the need of working with a rather accurate focusing of the laser beam on the print element. This demand is difficult to meet in the desirable extremes, as certain basic problems in relation to an accurate focusing occur as a consequence of fact that: the laser beam is subjected to changes of direction between a point of deflection and a line segment swept by the beam on the receiving surface, whereby the length of the beam and hence the focal point will change all the time as seen from the planar receiving surface; the focal point of the beam may be outside a larger or smaller part of the receiving surface, unless this is placed at a very accurate prescribed distance from the scanner; during their runs back and forth the scanner lines will overlap each other in the reversing areas making it difficult to produce unambiguous print patterns in these areas; the same overlap gives rise to a noticeable power problem, because double power is dissipated in the overlap areas; the prior art scanners are rather slow in operation.

An associated further purpose of the invention is to provide measures for extensive remedy of these adverse conditions, i.e. to provide a scanner, which is able to operate fast and with an accurate focusing while maintaining an almost maximum and extremely well defined working width. Generally, for various reasons it is difficult to operate with an accurate scanning, when the effective working width exceeds about 40 cm; though the invention involves aspects that might contribute to improvement also of this condition, this is not to be further discussed here.

Light scanning is most frequently performed by using a rotating polygon mirror hit by a light or laser beam, which beforehand has passed a focusing lens and by the successive passings of the rotating mirror facets is caused to sweep across the surface to be treated. The surface is moved relatively to the scanner in the transverse direction of the lines, which the scanner hereby "draws" on the surface, whereby a larger area can be treated successively. When the beam is modulated, while the light spot is running through the individual lines for example, is switched on and off or intensity controlled from an associated control unit, the desired pattern of treatment can be produced with more or less accuracy according to the quality of the scanner.

The beam length between the focusing lens and the working surface will be shortest for the beam which, in the center position of the mirror facets, impinges on the surface at right angles, whereas, the length increases towards both sides. If the focusing is sharp in the center area, it may, in case of a fairly large working width, be difficult or impossible to obtain sharp focusing in the outer areas, unless the working surface is curved on a cylinder face with the axis going through the focusing lens. However, this problem, mentioned, for example, above, has already been solved in principle, by the application of a correcting optics, which is passed by the oscillating beam and varies its focal length, for example, the distance to the focal point, according to the swing angle, just so that the focal point can be held on a planar surface fairly uniformly all over the line.

In return the working surface must then be positioned at the distance in question from the lens or from the device as such. A certain slight variation of the distance may be tolerated, which also is needed in practice, but this immediately entails another problem, for example, i.e. a slight increase in the distance will mean that the increase in length of the outermost swung out beams in the angle position in question will be larger than the increase in length of the center beam. This has two adverse effects, for example, partly the possible range of variation of the position of the working surface is limited by the fact that it must be within the depth definition of the outer beams, and partly a change of position of the working surface will mean not only a relatively larger change of length of the outer beams, but also a corresponding change of the effective length of the working line on the surface. When the distance is increased, the outer beams will reach farther out on the surface, and if, during the movement of the scanner relative to the surface the distance variations in question occur, the result will be that the working width mill vary so that straight lines, which in the outer areas of the working lane extend in the longitudinal direction thereof, will be correspondingly distorted or wavy.

This presents a problem in itself, but particularly so when entire working lanes shall be caused to join each other very accurately, as in case of the technique which is the primary aspect of the invention. A genuinely accurate print will require a practically unrealistic accurate set-up of the working surface relatively to the scanner and to the applied moving means.

According to the invention, the beam is caused to pass an optical system at a short distance outside the working surface, preferably a lens bar which is adapted to deflect the beam everywhere in such a manner that all over the length of the working line it impinges perpendicularly on the working surface. Thus, the lens will be a convex lens with its focal point positioned in the area such as said polygonal mirror, from which the beam is oscillated.

Thus, this lens must extend throughout the working line, for example, it is a fairly large optical element, but, apart from the length dimension the element may be of a rather moderate size, as it is to operate exclusively with a beam which is oscillated in a fixed plane relatively to the scanner, i.e. the lens bar may have a thickness of, for example, only a few millimeters.

When the beam is at all times delivered perpendicularly onto the working surface, a possible slight deviation of the distance of the working surface from the scanner, as viewed along the working lane, will not cause any distortion of the print pattern. In case of such a deviation, the outer beams will not strike the working surface correspondingly farther out or in, and the length of the working line will remain constant. In addition an improvement with respect to the other problem is obtained in that the length of the outer beams are not shortened, as they are now sent from the lens directly, not obliquely towards the surface. Though this shortening is not very large, it still means that the depth definition range can be utilized better when not limited by a slanting of the outer beams.

Thus, the result is that hereafter it will be possible to perform the work extremely accurately, e.g. with degrees of resolution of less than 1/10 mm, without the need of overwhelming accuracies with respect to the positioning of the working surface; the distance of this surface from the scanner may vary several millimeters or even a few centimeters.

The demand for the high degree of resolution involves another aspect; namely, that very thin focusing beams must be used, e.g. with, for example, a thickness of 25 microns, and as the working lines should be closely adjoining in order to ensure full continuity of the print, the speed of operation understood as the speed of displacement along the working lane will be determined by the velocity with which the working lines can be successively terminated for yielding their respective contribution of, for example, 25 microns to the displacement. It goes without saying that the working lines must be produced with a quite high frequency in order to enable operation with a fairly realistic velocity. Obviously, quite high line frequencies can be obtained by application of a rotating polygonal mirror, though centrifugal forces set certain limits to the speed of rotation, but, in the use of rotating, mirror facets considerable losses occur, which are unacceptable when, as in the present invention, ultraviolet light is primarily applied which is expensive to produce. The explanation of these losses is that at each passage of a corner between two mirror facets past the incident laser beam having a certain thickness, which considerably exceeds the 25 microns mentioned by way of example, a splitting up of the beam between the two facets takes place, and while this is going on, neither of the beam parts will be usable for effective operation, that is, the beam should be switched off in this transitional phase, which, according to the circumstances, may occupy a considerable percentage of the operating time. Thereby the switching off will not bring about any essential saving, as the laser device in itself has to operate with full power in the meantime.

As an alternative to the rotating polygonal mirror it is known to use an oscillating goniometer mirror, which is in permanent contact with the incident beam and can be vibrated in a controlled manner to produce a back and forth swinging of the light beam without the occurrence of the ineffective operating phases.

Within certain limitations these single mirrors can be controlled to perform a backward and forward turning with constant angular velocity, whereby there will be a linear relationship between the turning and the travel of the light spot along the working line, so that there is no unlinear function to be considered with regard to in the programming of the print pattern. However, it is significant to the speed of operation of such mirrors that a short ineffective period must necessarily occur each time the mirror is turned to an extreme position and thereafter is to be turned back. Even this condition sets a noticeable limit to the speed Of operation, and it must be realized that the line frequency obtainable in this manner is much too low to permit operation with a practically acceptable velocity.

It is already known that the oscillating frequency of goniometer mirrors can be increased quite essentially by the application of a resonance system, whereby the mirror oscillates with a sinusoidal characteristic. Mirror oscillations with such a high frequency would be desirable in connection with the invention, but then the problem arises that, due to the non-constant angular velocity of the sine function, a non-linear speed of movement of the light spot on the working surface will occur, and it appears to be difficult to program a computer to take this non-linear relation into account, though this would be a possibility according to the invention. The invention provides a quite different possibility, for example the application of an optical correction, the swinging beam from the oscillating mirror being passed through at least one fixed mirror, the mirror face of which is so shaped that the beam reflected therefrom will swing with a uniform angular velocity, when the incident beam oscillates with an angular velocity according to a sine curve, whereby the desired alteration of the characteristic of the movement will be obtained.

Another and more essential problem in the application of a beam oscillating with a non-uniform angular velocity is the fact that the light spot will be moved with uneven velocity along the working line, the velocity in connection with a sinusoidal oscillation being maximum at the center of the line and quite low at the outermost end or turning areas. If the relative movement between the scanner and the working surface takes place with a uniform velocity in order that the successive working lines shall adjoin each other edge to edge over a fairly broad center area, then the lower travelling velocity of the light spot at the outer areas will cause an overexposure in these areas. This can be remedied in that the outer areas are made ineffective by switching off the beam, but as mentioned above such switching off will imply a appreciable loss of efficiency, if it extends over a considerable time, as the laser device is operating continuously. Thus, the uniform speed of movement and an only slight lateral overtravel are a primary condition of avoidance of such losses.

However, by using oscillating mirrors, which in some way produces a light spot travel with uniform velocity along the working line, a still larger problem may occur; namely a possible overlapping of the paths of movement of the light spot in connection with each turning of the light spot movement some distance before and some distance after the turning, as these paths having a certain width are entirely coincident in the very turning points. If or when the paths, for example, the working lines, are to adjoin each other edge to edge at the center of the field, namely by displacing the scanner relative to the working surface with a velocity of one line width per half oscillation of the beam, these overlap areas will extend nearly throughout the length of the working lines, varying between full overlapping at the ends and no overlapping exactly at the center of the field. This presents almost impossible control conditions, wherefore it may be more appropriate to prefer the solution allowing the working lines to be completely parallel with each other by the application of a rotating polygonal mirror.

To solve this problem it will be in any case a theoretical possibility to make provision for holding the oscillating mirror still for a very short period in each of its outer positions and for utilizing this short period to advance the scanner/working surface a distance just corresponding to a line width; whereas, that advance is suspended during each line passage of the light spot. However, for several reasons this will presumably be totally unrealistic; hence this solution will not be further discussed.

However, the present invention provides an extremely simple solution of the problem in question, namely, the provision of such a control of the light beam in a plane perpendicular to its plane of oscillation that the light spot at the termination of each swing is displaced one line width transversely of the working line, while the beam and hence the light spot during the tracing of the subsequent working line is corrected in the transverse direction to a position edge to edge relatively to the preceding working line. With the simplest type of control this will be reflected in the working lines being perpendicular to the direction of displacement between the scanner and the working surface, that is, irrespective of the fact that this displacement is maintained with uniform velocity during the entire process. An overexposure will occur only in the turning points, where the light spot stays at the transition from the end point of the working line to the short transverse movement to the start point of the succeeding working line. For a perfect operation, the beam should be switched off just in this transition area, but in view of the fact that the extension thereof is of the order of 20–30 microns unlike an essential part of the total length of the working line, this necessary switching off will not mean any considerable loss of energy or any significant narrowing of the effective working width.

The transverse displacement in question of the beam or light spot is of such a small size that it can be produced by an almost microscopically small movement of a mirror in the beam path, and in a preferred embodiment a mirror mounted on a piezoelectric crystal in front of the goniometer mirror, for example, at a fairly long distance from the working surface, is used for this deflection. It will be understood that a microscopic movement will suffice here, when the beam spot is to be swung 20–30 microns from a distance of maybe half a meter. The same transverse displacement mirror can by suitable control of said crystal be caused to bring about such corrections of the beam direction which might be desirable to correct irregularities in the remainder of the optical system with a view to bringing about a working line which is rectilinear in an almost absolute sense.

Summarizing, the transverse control of the oscillating beam makes it practically possible to utilize a back and forth swinging deflecting mirror with negligible losses, and by the optical transformation of a sinusoidally oscillating light or laser beam to a working beam, which is parallel displaced with a uniform velocity all along the working line, several advantageous effects are obtained, namely, partly a very high capacity of work by the application of a resonance oscillating deflecting mirror, partly a very high efficiency of the system, because an operative switching off of the beam may be limited to extremely short time intervals, partly an accurate focusing of the beam all over the length of the working line, and partly a well defined and exactly linear merging of the side edges of the individual working lanes, when these are set up edge to edge for forming broad working faces.

Within the scanner, as shown in FIG. 3, the laser beam 32 passes first a focusing lens 42 and thereafter hits a mirror 44, which is firmly mounted on a piezoelectric crystal in a housing 46, from which the beam is directed towards a vibrating mirror 48 connected to a goniometer 50. This mirror oscillates laterally as a resonance oscillating goniometer mirror thereby transmitting the now oscillating beam 20. This beam 20 is directed towards a primary mirror 52, from which the beam 20 is reflected to a secondary mirror 54 and, thereupon, reflected forwardly through a bar lens 56 for incidence on the print frame 14.

The focal length of the focusing lens 42 is so adapted that the beam 20 will be maximum focused, for example, down to a width of 25 microns, at the incidence on the print frame 14.

Thus, during a vertical movement of the scanner 12 the vertical lane field 18 on the print frame 14 will be exposed by the back and forth swinging beam 20 which, by the control unit 30, will be switched on and off for the production of desired differentiated pattern details. After the exposure of the vertical lane field 18 the scanner 12 is moved to an adjacent position on the cross rail 6, so that thereafter another vertical lane field 18, adjoining the previous vertical lane field can be exposed. In this way the entire print frame can be exposed by use of the required number of horizontal shiftings of the scanner 12, hereby it only is very important that the respective side edge areas of the vertical lane fields 18 are exactly coincident.

As previously mentioned a first problem hereby is that the working surface or print frame 14 hardly can be placed at an entirely accurate and uniform distance from the scanner 12, so that problems with respect to varying length of lines 16 may arise. This problem is met by the application of the bar lens 56, with this lens 56, as shown in FIG. 4, being so arranged that at every place it deflects the oscillating beam 20 in such a manner that the beam everywhere is directed perpendicularly onto the working surface, whereby the length of line will be independent of whether the working surface is spaced more or less, from the scanner.

Figure 5:
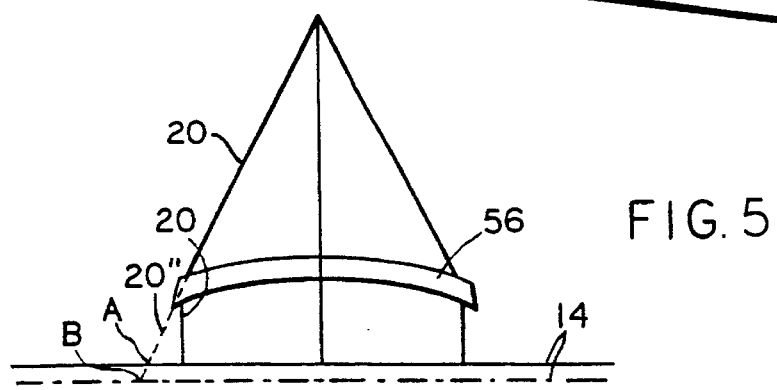
FIG. 5 is a schematic view for further explanation of FIG. 4.

FIG. 5 shows in more detail that the beam 20 will pass perpendicularly on to the working surface also at the outer ends as indicated by 20' and it will furthermore be seen that the point of incidence of the beam 20' on the working surface 14 will be the same whether this surface is spaced a little more or less from the scanner. The outer oblique beam 20 would, in the absence of the bar lens 56, continue as shown by 20" with a point of incidence A on the surface 14. If the surface is withdrawn to the position shown in a stippled line, this point would obviously be displaced outwardly to the point B, whereby the previously mentioned drawbacks would arise. Furthermore it will be seen that the beam 20" is slightly longer than the beam 20' so that, by the use of the lens 56, a more uniform focusing on the working surface all along the working line is obtained.

Figure 6:
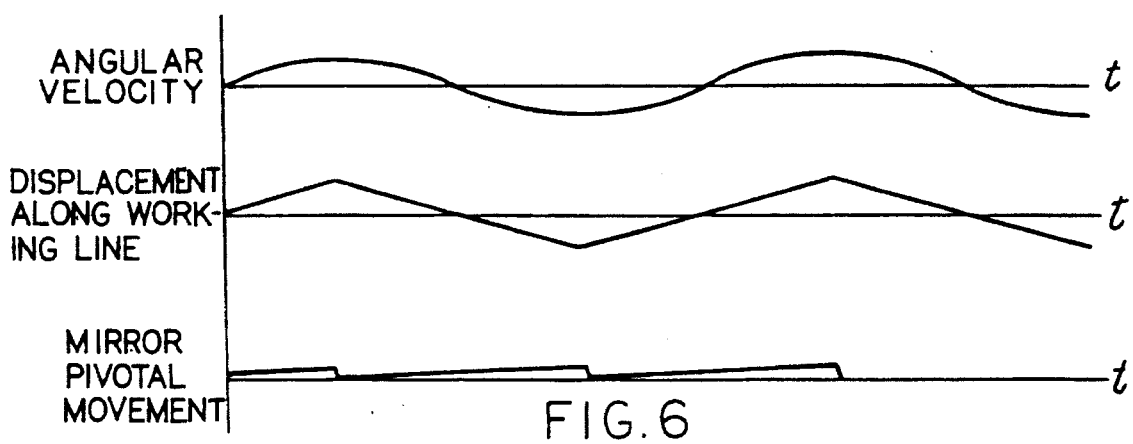
FIG. 6 are graphical curves illustrating movements of an oscillating mirror used in the system of FIG. 4.

The goniometer mirror 48 performs rapid resonance oscillations, for example with an angular velocity varying in accordance with a sine curve as shown at the top of FIG. 6. The frequency of oscillation may be very high, e.g. 2–3 kHz, which is conditional of a usable capacity of the whole device, e.g. with a treatment time of about 5 minutes for a surface area of 1 $m^2$. The sinusoidal oscillation is reflected only in a non-uniform velocity of movement of the light spot along the working line. However, the secondary mirror 54 is made with such a shape that it purely optically corrects for the non-uniformity, so that the oscillating beam leaves the mirror with a uniform angular velocity. The same correction could be made at the primary mirror, but, due to its narrower range of operation, this mirror would be more difficult to form with exactly the required shape, which, of course, would be still more pronounced as regards the goniometer mirror. The correcting shape has not been further illustrated, but will be defined by the established conditions.

The center curve in FIG. 6 represents the uniform and also rectilinear displacement of the picture point along the working line, i.e. the sine curve after the performed optical correction. The maxima and minima of the curve designate the opposite ends of the working line, at which points the curve has a locally rounded shape, as the turning of swinging direction of the beam cannot be carried out absolutely instantaneously. Thus, distortions of the print may occur in the very narrow turning areas in question, but, in a preferred embodiment, these areas are eliminated from the working field by causing the control unit 30 to switch off the beam in the areas, which gives rise to a negligible loss only.

As mentioned above there is another condition which might give rise to much higher losses or make the use of the resonance oscillating mirror 48 completely impossible, mainly, the fact that, at each turning, the beam will produce a new working line, which will largely overlap the previous line. The invention proposes to remedy this by controlling the piezoelectric crystal in the housing 46 to produce during the formation of each entire working line a slight progressive deflection of the beam 20 in a direction perpendicular to the swinging plane of the beam, for example, in the direction of the axis of oscillation of the goniometer mirror 48 with a rapid return to the start position at each turning of the beam. The associated pivotal movement of the mirror 44 is shown by the lowermost curve in FIG. 6. When the scanner is operating with a downward movement, each working line 16 will initially slope slightly downwardly, but the control of the crystal to produce a slight upward deflection of the beam results in the lines 16 being drawn exactly horizontally, the total displacement in a vertical upward direction amounting to just a line width, for example, the diameter of the focused ultraviolet beam. The quite abrupt return of the mirror to its start position will cause an almost entirely vertical and very nearly instantaneously swinging down of the beam, which is thereby displaced a line width downwardly, and, during the immediately succeeding return swing of the beam, the light spot will draw a new horizontal working line which, in an ideal manner, will be placed edge to edge with the preceding line entirely without overlapping or spacing between the lines, for example, with a line drawing as ideal as in the use of a rotating polygonal mirror.

Figure 7:
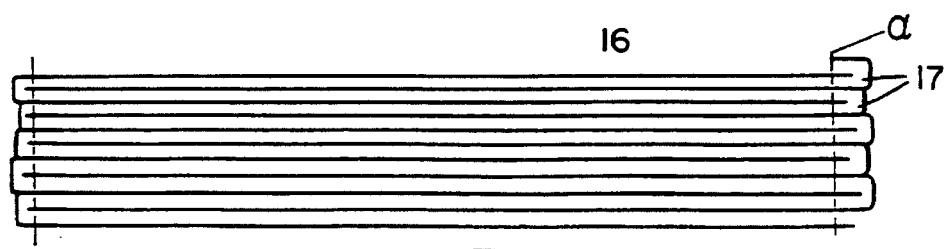
FIG. 7 is a graphical depiction of the light spot path on the working surface.

The drawing of lines described here is illustrated in FIG. 7 in which said vertical and or turning movements of the lines 16 are designated 17. It is indicated that very small irregularities may occur in the swings of the beam 20, but particularly by using a resonance oscillating mirror it is possible to keep the irregularities so small as to be of no practical significance, even if a high degree of accuracy of the edge limitations of the working lanes 18 is required, when these lanes are to be joined as parts of one and the same print surface. Furthermore it has been shown in stippled lines a that these lines between them delimit an irradiated face of considerable width, on which a completely regular pattern of parallel, edge to edge adjoining lines 16 occurs; so it is sufficient to keep the beam switched off in quite narrow areas outside the lines a, which incidentally, of course, will follow the small irregularities of the position of the line ends. These very small, permanent switching off areas are conditional of working with very low losses, this being one of the very important advantages of the invention relatively to the use of polygonal mirrors.

There will hardly be anything to prevent the production of a mirror goniometer, the mirror of which is able to swing in both one plane and the other for integrating the functions of the mirrors 48 and 44, just as the vertical deflection of the beam could be brought about elsewhere in the system, but just the application of a crystal controlled mirror must be assumed to be the simplest arrangement for the attainment of the desired result. Incidentally it should be remarked that an extremely exact production or fine working up of the optical elements is required to obtain an exactly rectilinear course of the working lines 16. Just the use of the crystal controlled mirror 44 makes it possible to electrically introduce corrections of adverse bulges on the lines, which can be much easier than to correct the error in question in the optical system.

It should be noted that it may be desirable to guide the scanner unit along laser beams in order that a perfect result shall be obtained.

I claim:

1. A printing method comprising the steps of:

forming a printing surface by placing a photosensitive emulsion on a permeable fabric layer of a serigraphic print frame;

longitudinally moving said printing surface with respect to a light beam;

exposing said printing surface by scanning said surface along transverse parallel lines within parallel longitudinal zones, each of said lines being bounded by respective accurately coincident side limitations, said scanning being conducted by transversely moving a light beam along successive parallel lines across said zones, said light beam being switched on and off, in accordance with a model printing pattern, whereby to form a printing area;

controlling said light beam to switch off when said light beam moves beyond a respective accurately coincident side limitation;

treating the so exposed printing surface for development and fixation of each said printing area.

2. A scanning device for exposing to light a printing surface formed by placing a photosensitive emulsion on a permeable fabric layer of a serigraphic printing frame, said device comprising:

a plurality of scanning units for directing laser light beams toward said printing surface, said laser light beams irradiating said printing surface sweeping along lines that extend transverse to parallel, longitudinal zones of said printing surface, said zones being defined within respective accurately coincident side limitations;

means for moving said plurality of scanning units and/or printing surface longitudinally relative to each other; and a control unit operatively connected to said laser light beams for turning said laser light beams on and off in accordance with a desired model pattern and for turning said laser light beams off when said laser light beams sweep outside a respective accurately coincident side limitation.

3. A scanning device for exposing to light a printing surface formed by placing a photosensitive emulsion on a permeable fabric layer of a serigraphic printing frame, said device comprising:

a least one scanning unit for directing a light beam toward said printing surface, said light beam irradiating said printing surface sweeping along lines that extend transverse to parallel, longitudinal zones of said printing surface, said zones being defined within respective accurately coincident side limitations;

means for moving said scanning unit and/or printing surface longitudinally relative to each other; and a control unit operatively connected to said light beam for turning said light beam on and off in accordance with a desired model pattern and for turning said light beam off when said light beam sweeps outside a respective accurately coincident side limitation;

wherein the at least one scanning unit is provided with a lens bar having a convex lens and disposed a distance from said printing surface in a plane of movement of said light beam and a rotating or oscillating mirror disposed in relation to said convex lens focal point whereby said light beam impinges perpendicularly against said printing surface throughout a width of said lines.

4. A scanning device according to claim 3, wherein said lens bar has a width equal to at least twice that of said parallel zones, and said scanning device further includes a controlled optical element that displaces the light beam from the mirror by a line width transversely to a plane of movement of said light beam during each half period of an oscillation of said light beam and for displacing the light beam correspondingly, but abruptly and with an opposite sign, at each end of the successive working lines.

5. A scanning device according to claim 4, wherein the controlled optical element includes a mirror mounted on a piezoelectric crystal.

6. A scanning device according to claim 5, wherein a control unit is associated with said piezoelectric crystal and is programmable to correct orthogonal deflection of the light beam.

7. A scanning device according to claim 3, wherein the mirror is a goniometer controlled resonance swinging mirror, and wherein means are provided for producing a final beam travel along each working line with a constant velocity along a sine-function shaped path.

* * * * *